(12) United States Patent
Oh et al.

(10) Patent No.: US 12,191,427 B2
(45) Date of Patent: Jan. 7, 2025

(54) SEMICONDUCTOR DEVICE PACKAGE AND LIGHT EMITTING DEVICE COMPRISING SAME

(71) Applicant: LG INNOTEK CO., LTD., Seoul (KR)

(72) Inventors: Jung Hun Oh, Seoul (KR); Ki Cheol Kim, Seoul (KR); Kwang Ki Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 78 days.

(21) Appl. No.: 16/960,695

(22) PCT Filed: Feb. 1, 2019

(86) PCT No.: PCT/KR2019/001441
§ 371 (c)(1),
(2) Date: Jul. 8, 2020

(87) PCT Pub. No.: WO2019/151826
PCT Pub. Date: Aug. 8, 2019

(65) Prior Publication Data
US 2020/0357967 A1 Nov. 12, 2020

(30) Foreign Application Priority Data

Feb. 5, 2018 (KR) .................. 10-2018-0014194
Feb. 5, 2018 (KR) .................. 10-2018-0014195
Feb. 5, 2018 (KR) .................. 10-2018-0014197

(51) Int. Cl.
*H01L 23/34* (2006.01)
*H01L 33/58* (2010.01)
(Continued)

(52) U.S. Cl.
CPC .............. *H01L 33/58* (2013.01); *H01L 33/62* (2013.01); *H01L 33/48* (2013.01); *H01L 33/60* (2013.01)

(58) Field of Classification Search
CPC ... H01L 31/0203; H01L 33/486; H01L 33/58; H01L 33/642; H01L 2224/48091;
(Continued)

(56) References Cited

U.S. PATENT DOCUMENTS 4,254,453 A * 3/1981 Mouyard ................ G09F 13/22
345/82
4,306,716 A * 12/1981 James ....................... A63F 9/24
463/31
(Continued)

FOREIGN PATENT DOCUMENTS

EP 0 684 648 9/2000
JP 2007-311674 11/2007
(Continued)

OTHER PUBLICATIONS

International Search Report dated May 17, 2019 issued in Application No. PCT/KR2019/001441.
(Continued)

*Primary Examiner* — Mary A Wilczewski
*Assistant Examiner* — Tsz K Chiu
(74) *Attorney, Agent, or Firm* — KED & Associates LLP

(57) ABSTRACT

An embodiment provides a semiconductor device package and a light emitting device comprising same, the semiconductor device package comprising: a body including a first cavity; and a semiconductor device disposed within the first cavity, wherein: the first cavity includes a first surface inclined such that the area of the cavity gradually increases as going away from the semiconductor device, and a plurality of second surfaces perpendicular to the upper surface of the semiconductor device; the body includes a first outer surface and a third outer surface that are opposite to each other, a second outer surface and a fourth surface that are opposite to each other, a first corner portion disposed in a
(Continued)

region where the first and second outer surfaces meet each other, a second corner portion disposed in a region where the second and third outer surfaces meet each other, a third corner portion disposed in a region where the third and fourth outer surfaces meet each other, and a fourth corner portion disposed in a region where the fourth and first outer surfaces meet each other; and the plurality of second surfaces are disposed between the first and second corner portions, between the second and third corner portions, between the third and fourth corner portions, and between the fourth and first corner portions, respectively.

6 Claims, 15 Drawing Sheets

(51) Int. Cl.
    *H01L 33/62*         (2010.01)
    *H01L 33/48*         (2010.01)
    *H01L 33/60*         (2010.01)

(58) Field of Classification Search
    CPC ..... H01L 2224/73265; H01L 2924/181; H01L 23/3736; H01L 23/481; H01L 23/49866; H01L 23/13; H01L 23/367; H01L 23/373; H01L 23/48; H01L 23/498
    See application file for complete search history.

(56) References Cited

U.S. PATENT DOCUMENTS

| | | | | |
|---|---|---|---|---|
| 4,603,496 A * | 8/1986 | Latz | ......... | G09F 13/22 |
| | | | | 313/500 |
| 5,040,868 A * | 8/1991 | Waitl | ......... | H01L 31/02327 |
| | | | | 257/E31.127 |
| 5,043,716 A * | 8/1991 | Latz | ......... | G09F 9/33 |
| | | | | 345/82 |
| 5,635,115 A * | 6/1997 | Konishi | ......... | H01L 21/56 |
| | | | | 257/E21.705 |
| 6,274,924 B1 * | 8/2001 | Carey | ......... | H01L 33/60 |
| | | | | 257/676 |
| 7,326,583 B2 * | 2/2008 | Andrews | ......... | H01L 33/52 |
| | | | | 257/E33.059 |
| 7,517,728 B2 * | 4/2009 | Leung | ......... | H01L 33/507 |
| | | | | 438/122 |
| 7,682,853 B2 * | 3/2010 | Ashida | ......... | G02B 3/0031 |
| | | | | 438/33 |
| 7,692,206 B2 * | 4/2010 | Loh | ......... | H01L 33/486 |
| | | | | 257/E33.066 |
| 7,808,013 B2 * | 10/2010 | Mendendorp, Jr. | ...... | H01L 33/64 |
| | | | | 257/99 |
| 7,939,842 B2 * | 5/2011 | Loh | ......... | H01L 33/52 |
| | | | | 257/E33.059 |
| 8,348,461 B2 * | 1/2013 | Wilcox | ......... | F21V 31/005 |
| | | | | 362/240 |
| 8,446,004 B2 * | 5/2013 | Loh | ......... | H01L 33/644 |
| | | | | 257/710 |
| 8,455,891 B2 * | 6/2013 | Lee | ......... | H01L 33/20 |
| | | | | 257/676 |
| 8,791,486 B2 * | 7/2014 | Min | ......... | H01L 25/167 |
| | | | | 257/98 |
| 9,022,632 B2 * | 5/2015 | Kim | ......... | G02B 6/0073 |
| | | | | 362/97.3 |
| 10,500,770 B2 * | 12/2019 | Oliver | ......... | B29C 43/18 |
| 2002/0113244 A1 * | 8/2002 | Barnett | ......... | F21V 29/74 |
| | | | | 257/E33.059 |
| 2003/0168670 A1 * | 9/2003 | Roberts | ......... | H01L 33/642 |
| | | | | 257/E33.059 |
| 2003/0168720 A1 * | 9/2003 | Kamada | ......... | H01L 33/54 |
| | | | | 257/E33.059 |
| 2004/0041222 A1 * | 3/2004 | Loh | ......... | H01L 33/58 |
| | | | | 257/E33.072 |
| 2004/0173804 A1 * | 9/2004 | Yu | ......... | H01L 33/62 |
| | | | | 257/81 |
| 2004/0180459 A1 * | 9/2004 | Hsu | ......... | H01L 24/97 |
| | | | | 257/E33.072 |
| 2008/0087910 A1 * | 4/2008 | Andrews | ......... | H01L 33/58 |
| | | | | 257/E33.059 |
| 2008/0117619 A1 * | 5/2008 | Pang | ......... | F21K 9/00 |
| | | | | 362/267 |
| 2008/0164482 A1 * | 7/2008 | Obara | ......... | H01L 25/0753 |
| | | | | 313/503 |
| 2008/0283861 A1 | 11/2008 | Loh et al. | | |
| 2009/0129073 A1 * | 5/2009 | Yaw | ......... | G09F 9/33 |
| | | | | 362/231 |
| 2010/0328947 A1 * | 12/2010 | Chang | ......... | F21V 29/85 |
| | | | | 362/249.02 |
| 2011/0012148 A1 | 1/2011 | Bierhuizen | | |
| 2011/0037083 A1 * | 2/2011 | Chan | ......... | H01L 33/486 |
| | | | | 257/E33.056 |
| 2011/0248293 A1 * | 10/2011 | Chan | ......... | H01L 33/62 |
| | | | | 257/E33.056 |
| 2012/0104426 A1 * | 5/2012 | Chan | ......... | H01L 25/0753 |
| | | | | 257/88 |
| 2012/0193659 A1 * | 8/2012 | Andrews | ......... | H01L 33/486 |
| | | | | 257/E33.068 |
| 2014/0353694 A1 * | 12/2014 | Pang | ......... | H01L 25/0753 |
| | | | | 257/89 |
| 2018/0005999 A1 * | 1/2018 | Pang | ......... | H01L 33/62 |
| 2020/0098957 A1 * | 3/2020 | Pang | ......... | H01L 33/62 |
| 2020/0350468 A1 * | 11/2020 | Lee | ......... | H01L 33/38 |

FOREIGN PATENT DOCUMENTS

| | | |
|---|---|---|
| JP | 2009-246068 | 10/2009 |
| JP | 3205147 | 7/2016 |
| KR | 10-2009-0115803 | 11/2009 |
| KR | 10-2012-0048859 | 5/2012 |
| KR | 10-2012-0122048 | 11/2012 |
| KR | 10-2017-0021636 | 2/2017 |
| KR | 10-2017-0034927 | 3/2017 |
| KR | 10-2018-0009567 | 1/2018 |

OTHER PUBLICATIONS

Korean Office Action dated Aug. 17, 2022 issued in KR Application No. 10-2018-0014194.
Korean Office Action dated May 21, 2022 issued in Application No. 10-2018-0014195.
Korean Office Action dated May 22, 2022 issued in Application No. 10-2018-0014197.

* cited by examiner

[FIG. 1]
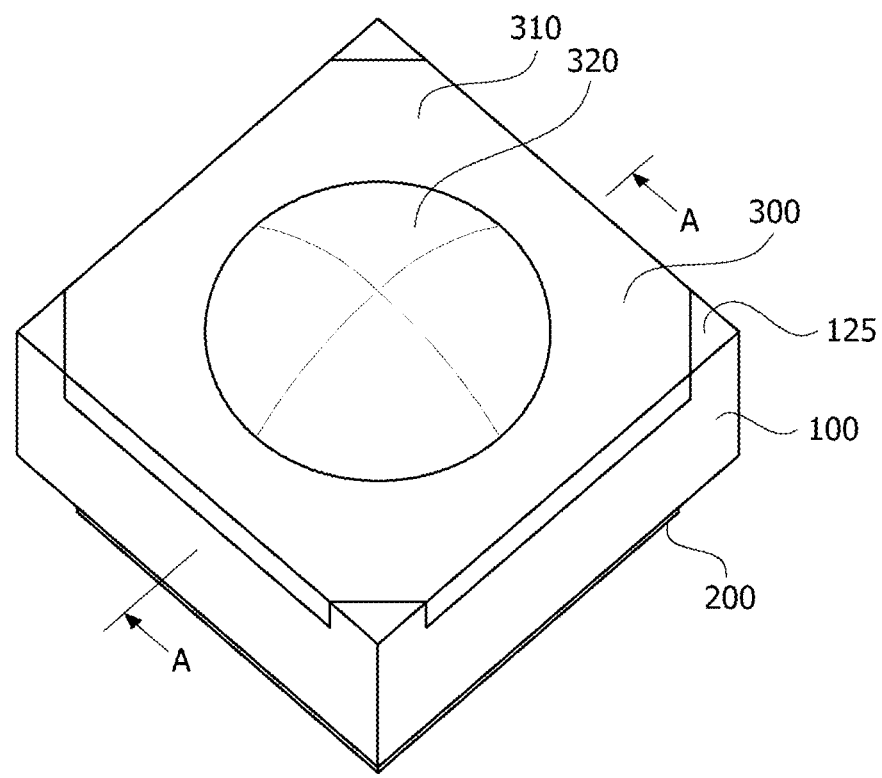

[FIG. 2]
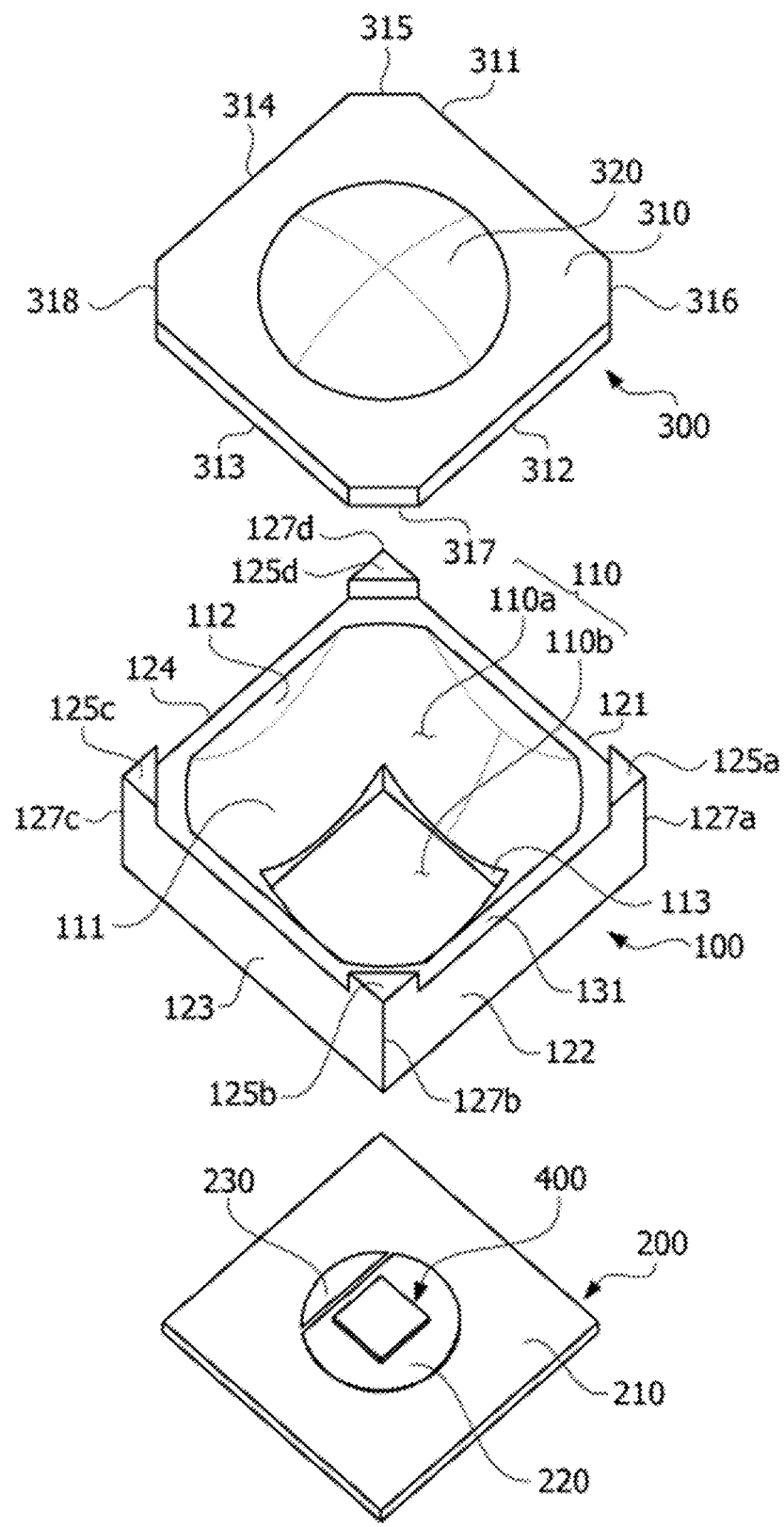

[FIG. 3]
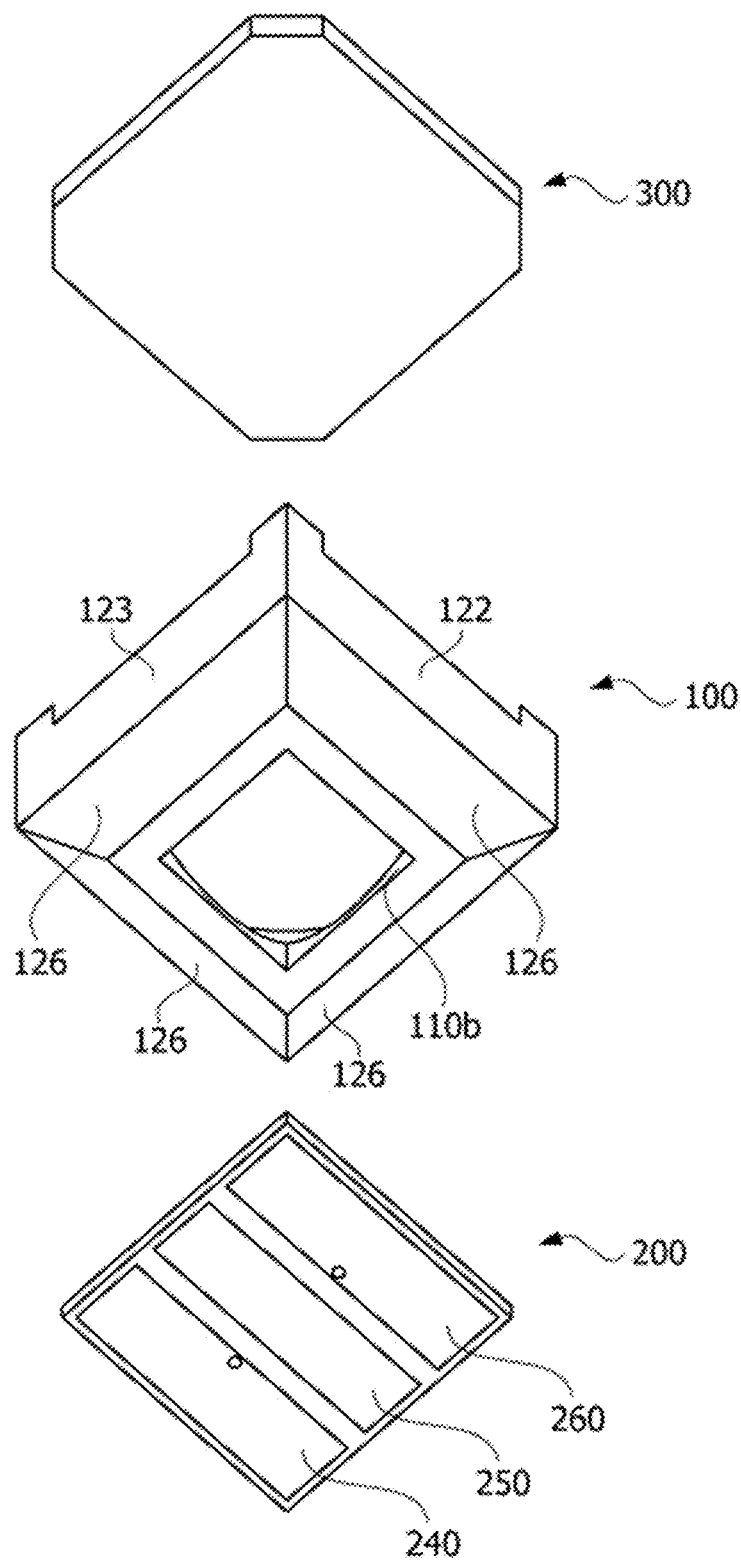

[FIG. 4]
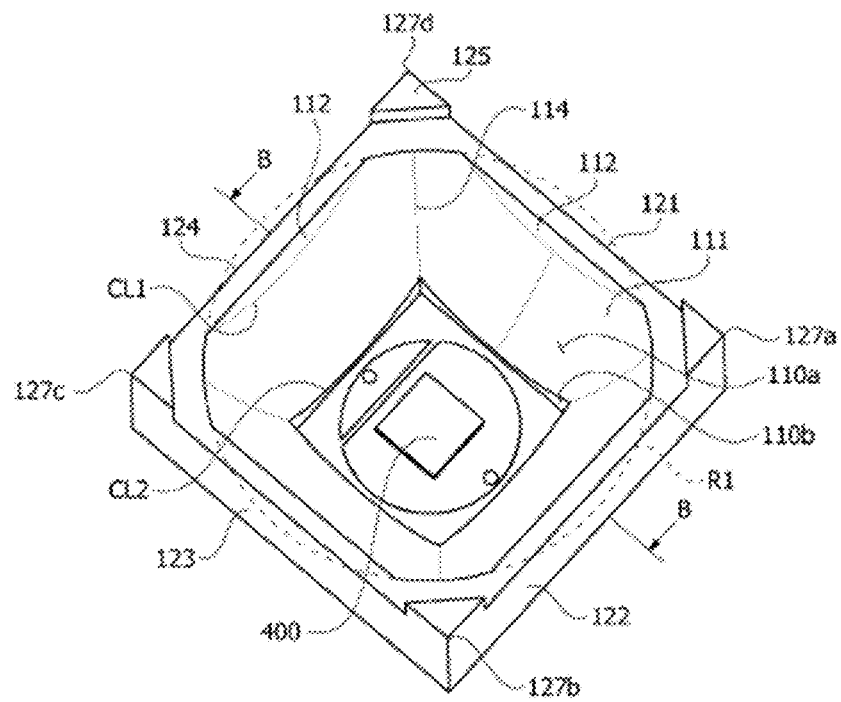
[FIG. 5]
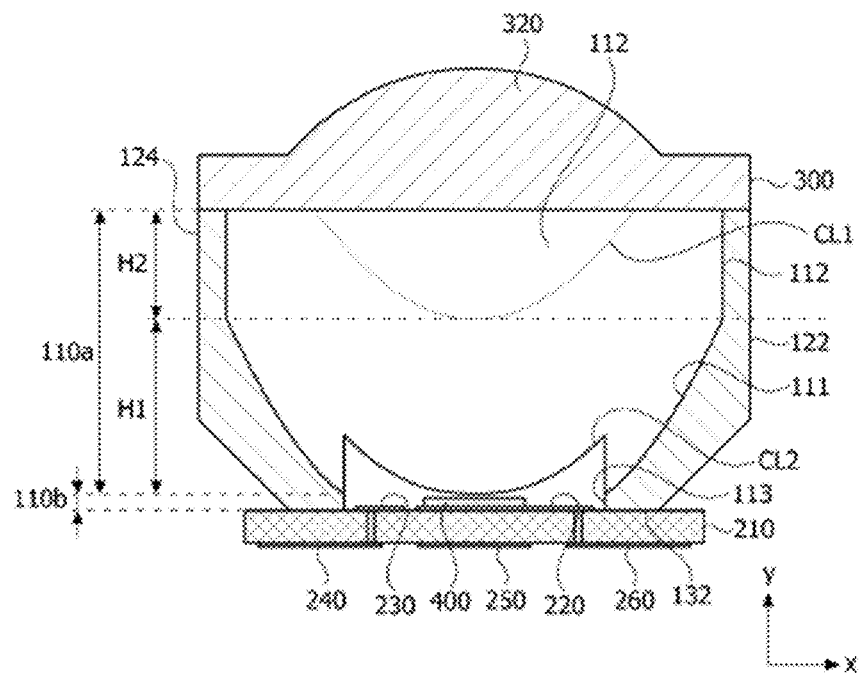

[FIG. 6]
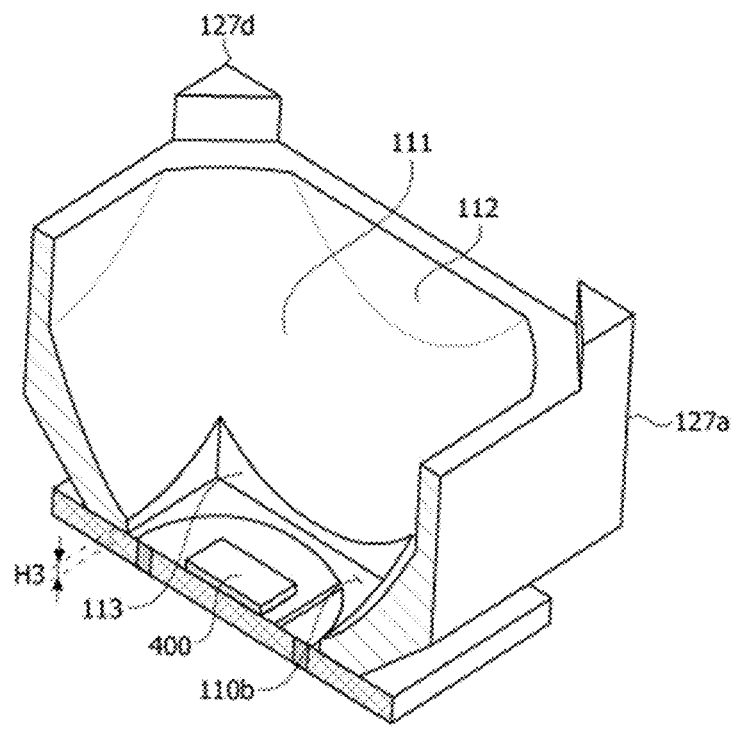
[FIG. 7]
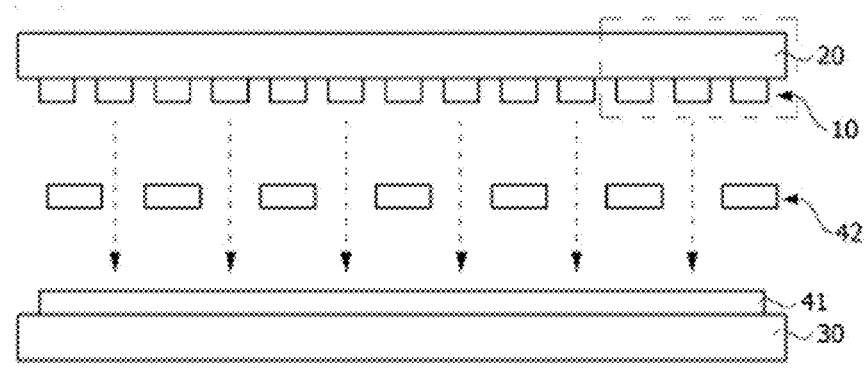
[FIG. 8]
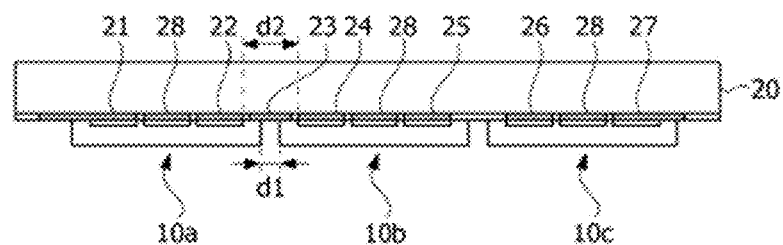

[FIG. 9]
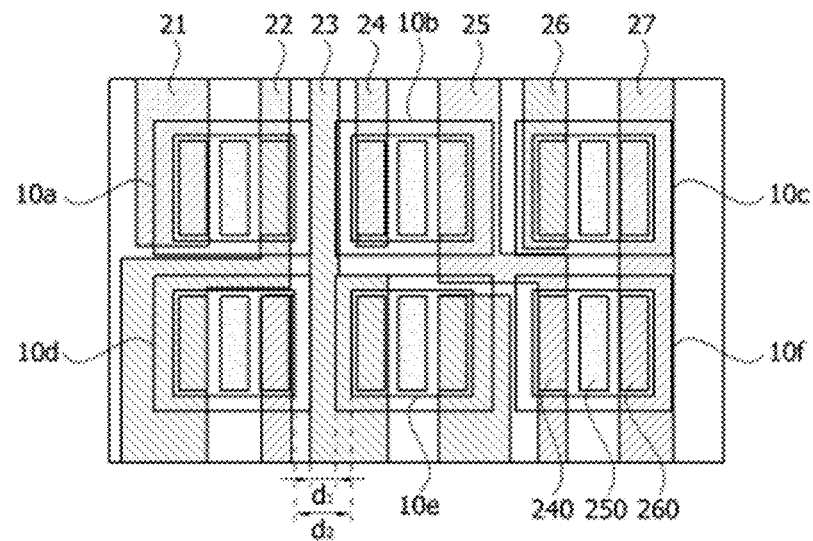
[FIG. 10]
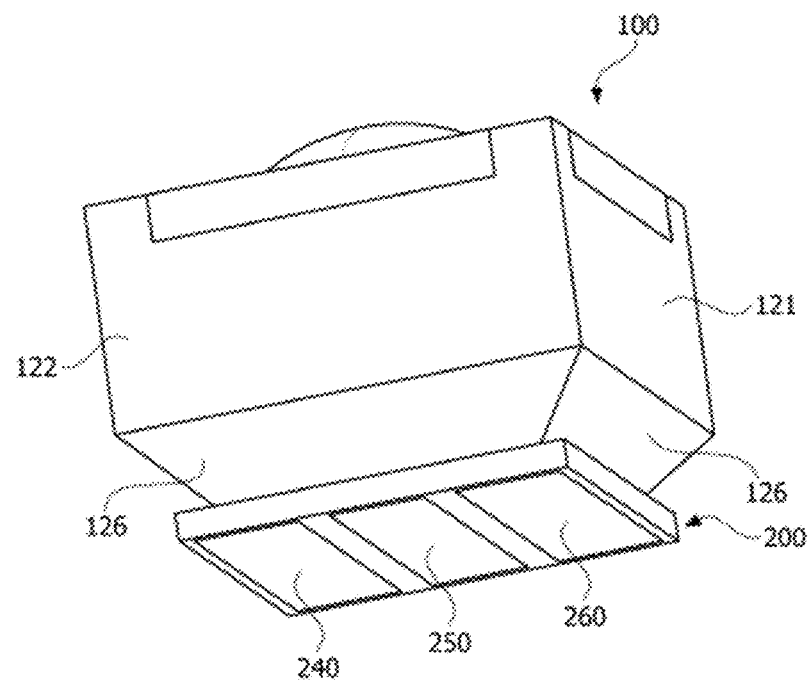

[FIG. 11]
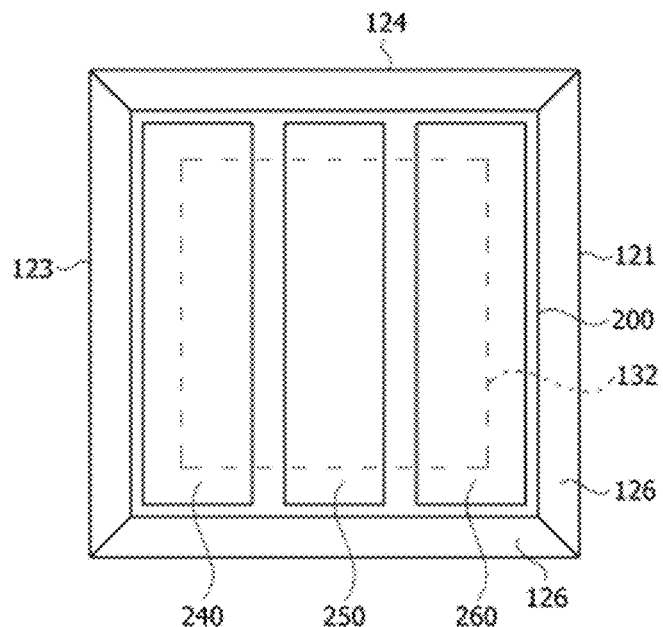
[FIG. 12]
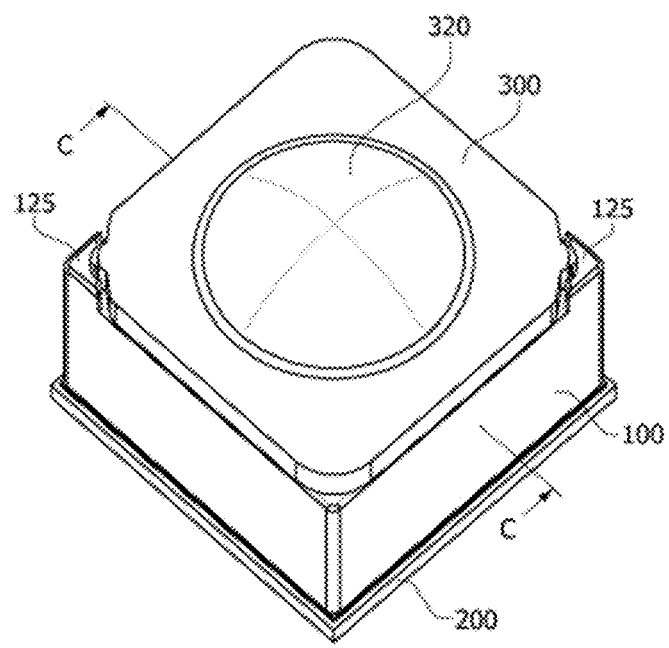

[FIG. 13]
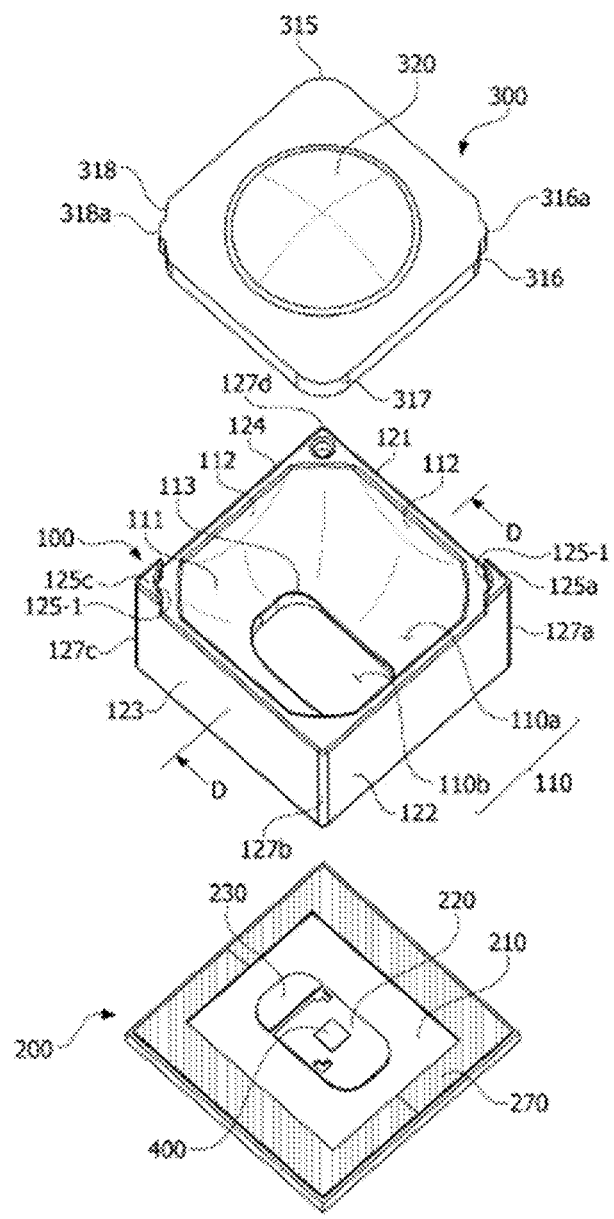

[FIG. 14]
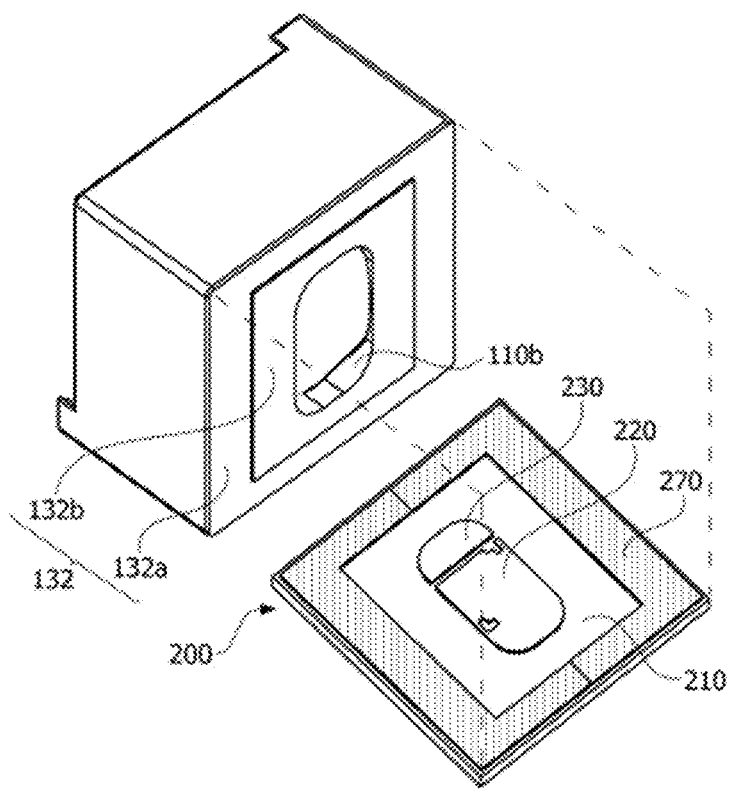
[FIG. 15]
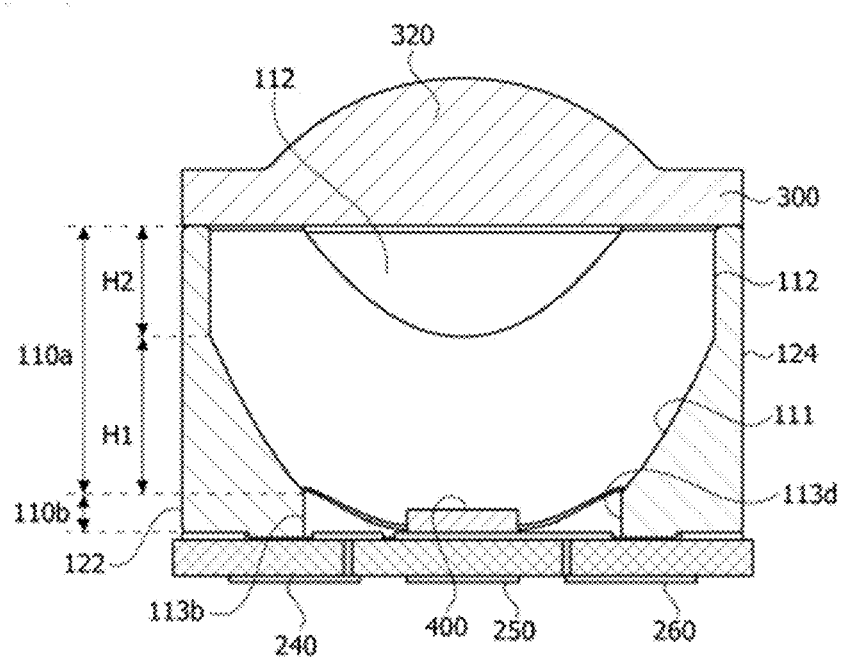

[FIG. 16]
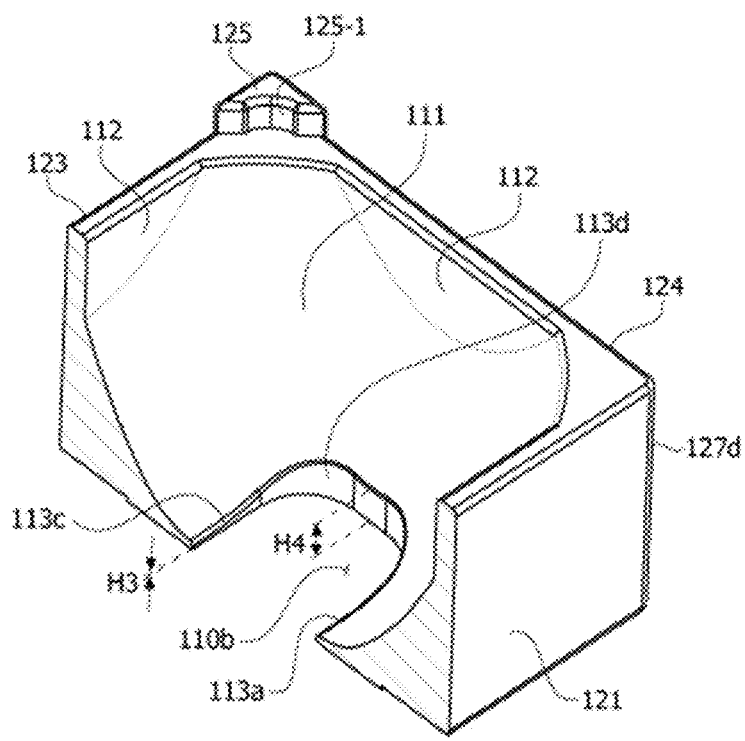
[FIG. 17]
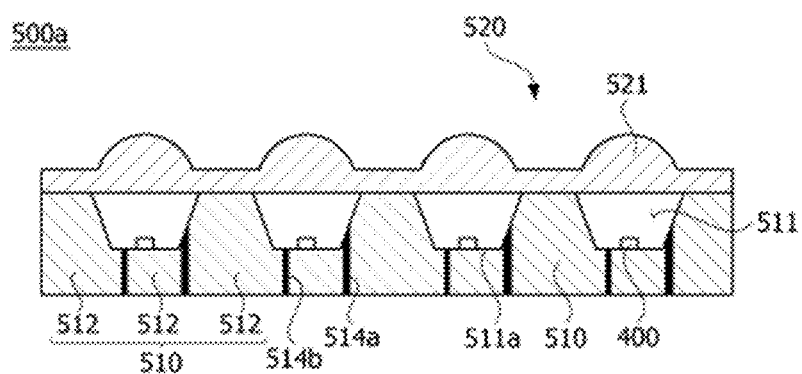

[FIG. 18]
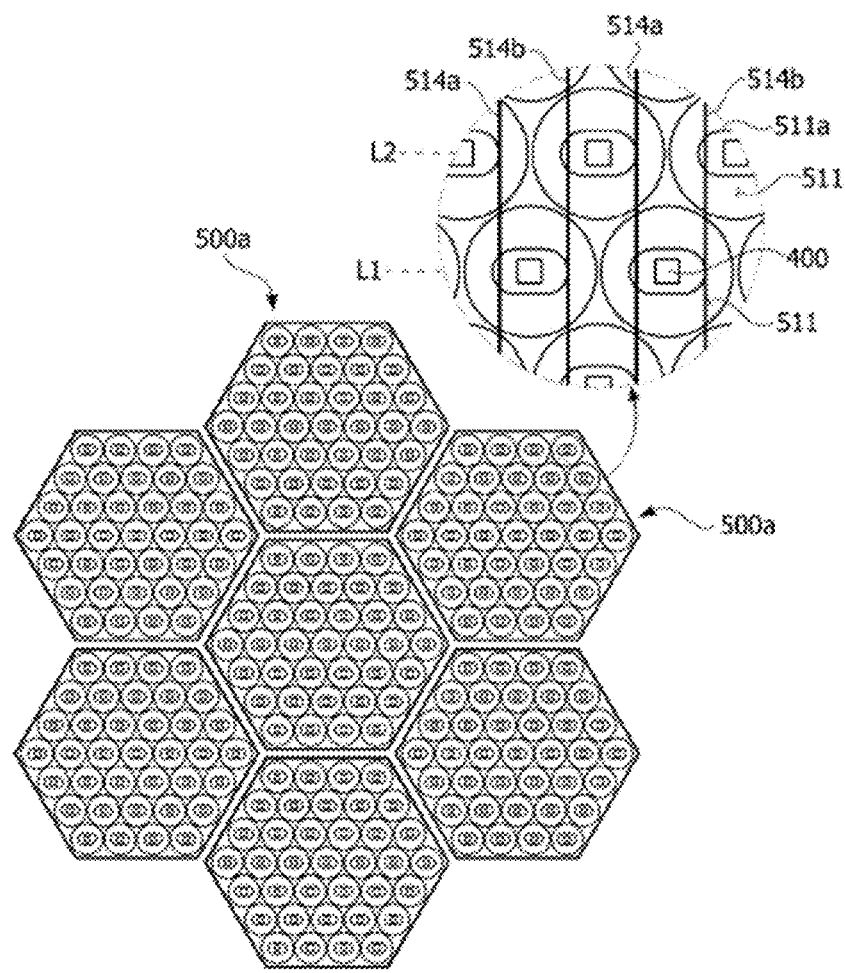

[FIG. 19]
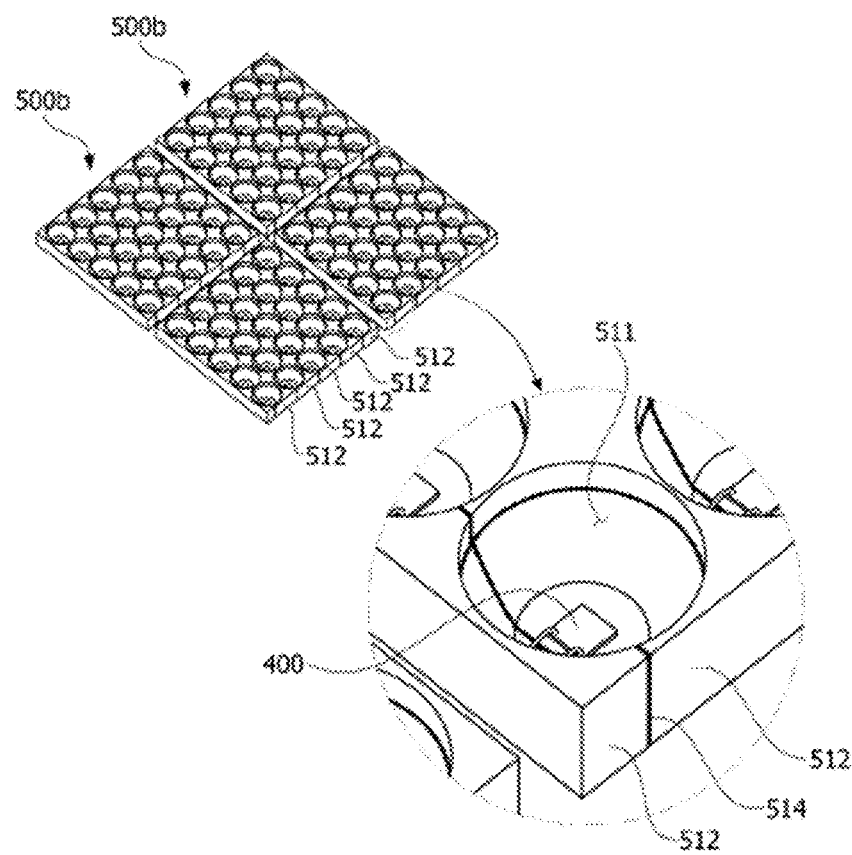
[FIG. 20]
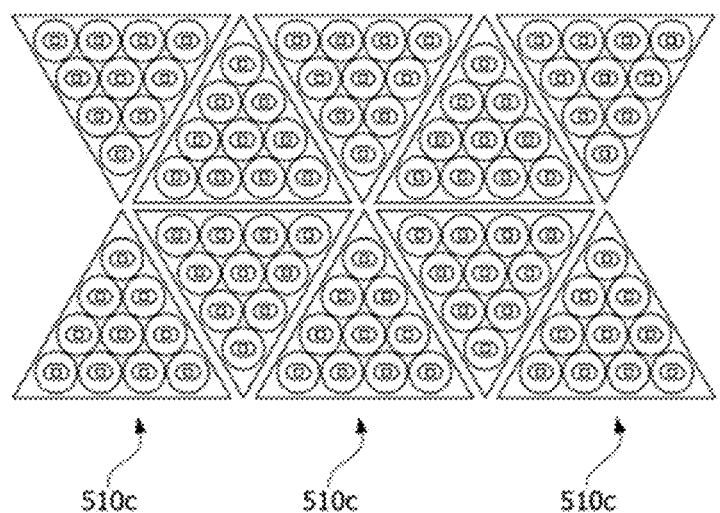

[FIG. 21]
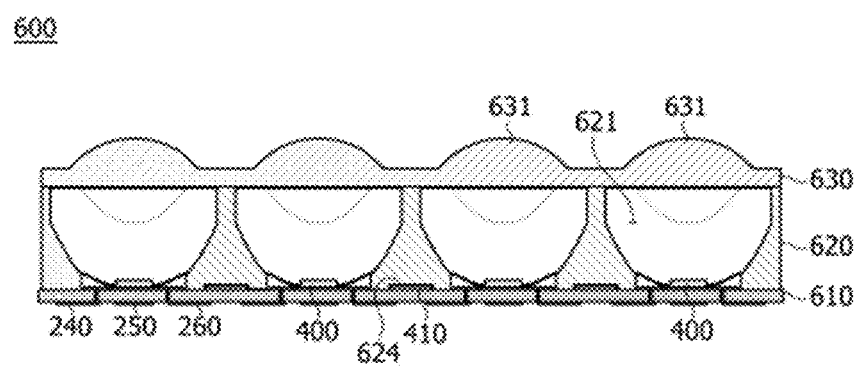

[FIG. 22]
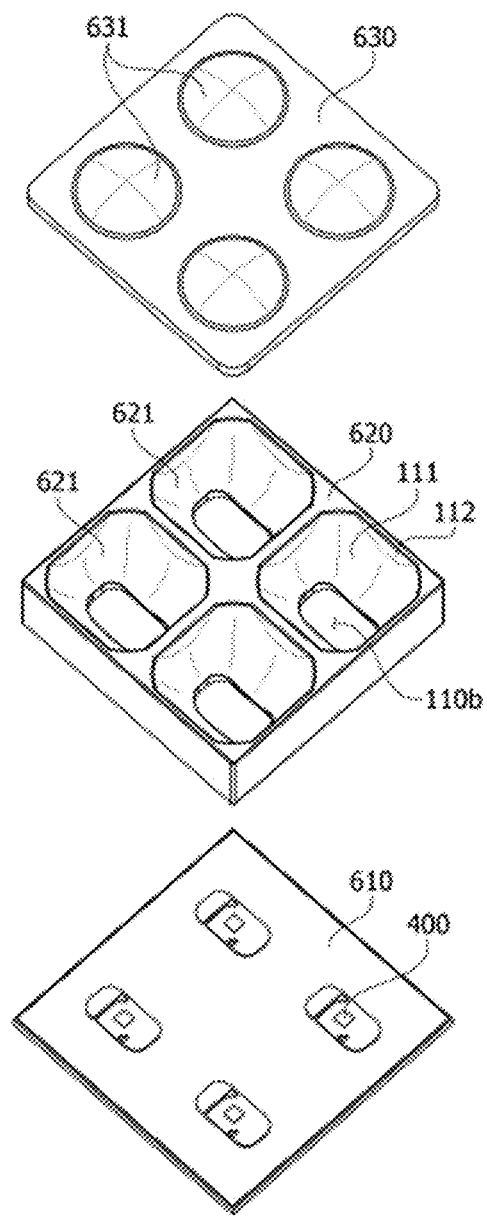

[FIG. 23]
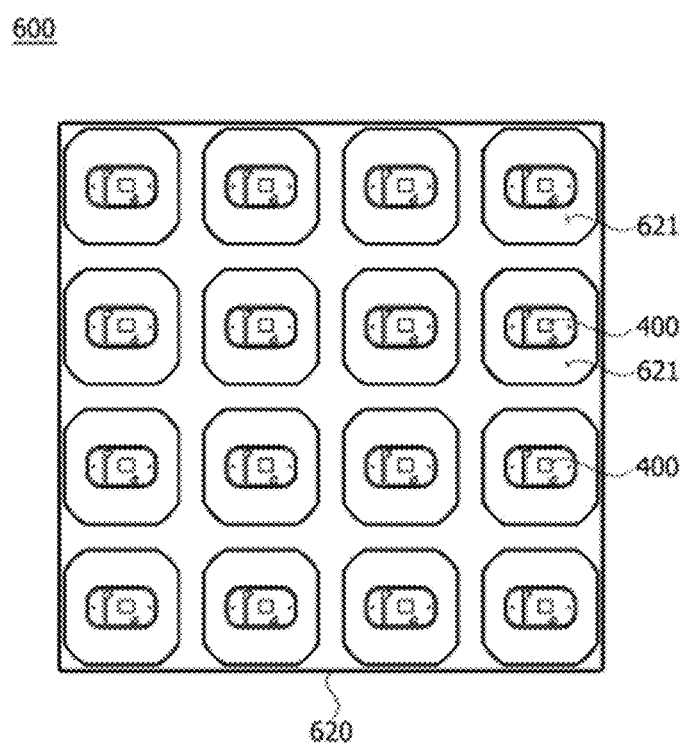

SEMICONDUCTOR DEVICE PACKAGE AND LIGHT EMITTING DEVICE COMPRISING SAME

CROSS-REFERENCE TO RELATED PATENT APPLICATIONS

This application is a U.S. National Stage Application under 35 U.S.C. § 371 of PCT Application No. PCT/KR2019/001441, filed Feb. 1, 2019, which claims priority to Korean Patent Application Nos. 10-2018-0014194, 10-2018-0014195, and 10-2018-0014197, all of which were filed Feb. 5, 2018, whose entire disclosures are hereby incorporated by reference.

TECHNICAL FIELD

An embodiment relates to a semiconductor device package and a light emitting device including the same.

BACKGROUND ART

Semiconductor devices including compounds such as gallium nitride (GaN) and aluminium gallium nitride (AlGaN) have many advantages such as having wide and easily adjustable bandgap energy, and the like and thus can be used in various ways as light emitting devices, light receiving devices, various diodes, and the like.

Specifically, a light emitting device such as a light emitting diode or laser diode using a group III-V or group II-VI compound semiconductor can realize various colors such as red, green, blue, and ultraviolet rays due to the development of a thin film growth technology and a device material, can realize white light with high efficiency by using fluorescent materials or combining colors, and can have advantages such as low power consumption, semi-permanent lifespan, and quick response speed, safety, and environmental friendliness in comparison with conventional light sources such as a fluorescent lamp, an incandescent lamp, and the like.

The semiconductor device can be applied as a light source of each of a transmission module of an optical communication means, a backlight of a liquid crystal display (LCD) device, a lighting device, a curing machine, and an exposure machine.

The exposure machine is a device which transfers a desired pattern to a photosensitive film by placing a mask where a desired pattern is formed on a sample coated with a photo-resist, that is, a material that reacts to light, and irradiating ultraviolet rays.

For example, in a semiconductor device or a printed circuit board (PCB), and a display panel embedded as a main component of an electronic device, a fine circuit pattern can be formed using photolithography technology in an exposure process.

A mercury ultraviolet lamp, a halogen lamp, or the like can be used as a light source of the ultraviolet exposure device, but the above-described lamps have problems of low efficiency and high cost.

DISCLOSURE

Technical Problem

An embodiment is directed to providing a semiconductor device package having a small size.

An embodiment is also directed to providing a semiconductor device package in which a lens can be easily mounted.

An embodiment is also directed to providing a semiconductor device package which can be densely disposed.

An embodiment is also directed to providing a semiconductor device package which can be easily manufactured.

Problems to be solved by the embodiments are not limited to the above-described problems, and purposes and effects understood from technical solutions and embodiments which will be described below are also included.

Technical Solution

One aspect of the present invention provides a semiconductor device package including: a body including a first cavity; and a semiconductor device disposed in the first cavity, wherein the first cavity includes a first surface inclined so that an area of the first cavity gradually increases in a direction away from the semiconductor device, and a plurality of second surfaces perpendicular to an upper surface of the semiconductor device, the body includes a first outer surface and a third outer surface opposite to each other, a second outer surface and a fourth outer surface opposite to each other, a first corner portion disposed in a region where the first and second outer surfaces meet each other, a second corner portion disposed in a region where the second and third outer surfaces meet each other, a third corner portion disposed in a region where the third and fourth outer surfaces meet each other, and a fourth corner portion disposed in a region where the fourth and first outer surfaces meet each other, and the plurality of second surfaces are respectively disposed between the first and second corner portions, between the second and third corner portions, between the third and fourth corner portions, and between the fourth and first corner portions.

The semiconductor device package may include a substrate on which the semiconductor device is disposed.

The body may include a second cavity connected to the first cavity and passing through a lower surface of the body, and a side surface of the second cavity may have a third surface perpendicular to one surface of the substrate.

Vertical widths of the plurality of second surfaces may decrease in a direction toward the first to fourth corner portions.

A width of the third surface in a first direction may increase in a direction toward the first to fourth corner portions.

A first boundary between the first surface and the second surface may have a curved line.

A second boundary between the third surface and the first surface may have a curved line.

The curved lines of the first boundary and the second boundary may have the same curvature.

The first surface may extend to the first to fourth corner portions to partition the plurality of second surfaces.

The second cavity may have a quadrangular shape.

The second cavity may include a first side surface and a third side surface opposite to each other and a second side surface and a fourth side surface opposite to each other, and lengths of the first side surface and the third side surface may be greater than lengths of the second side surface and the fourth side surface, and vertical widths of the second side surface and the fourth side surface may be greater than vertical widths of the first side surface and the third side surface.

Vertical widths of the plurality of second surfaces may be smaller than a vertical width of the first surface.

A ratio of the vertical width of each of the plurality of second surfaces to the vertical width of the first surface may be 1:1.2 to 1:1.8.

The substrate may include a first electrode on which the semiconductor device is disposed, a second electrode disposed to be spaced apart from the first electrode, and a first protruding portion disposed along an edge of the substrate, a concave portion configured to surround the second cavity may be disposed in the other surface of the body, and the concave portion may be disposed on the first protruding portion.

The semiconductor device package may include a light transmission member disposed on the body to cover the cavity.

Advantageous Effects

According to an embodiment of the present invention, the size of a semiconductor device package can be reduced.

Further, a lens can be easily coupled to the semiconductor device package.

In addition, semiconductor device packages can be densely disposed.

In addition, the semiconductor device packages can be easily manufactured.

Various useful advantages and effects of the present invention are not limited to the above and may be relatively easily understood in a process of describing exemplary embodiments of the present invention.

DESCRIPTION OF DRAWINGS

FIG. 1 is a conceptual diagram of a semiconductor device package according to a first embodiment of the present invention.

FIG. 2 is an exploded perspective view of the semiconductor device package according to the first embodiment of the present invention viewed from above.

FIG. 3 is an exploded perspective view of the semiconductor device package according to the first embodiment of the present invention viewed from below.

FIG. 4 is a view illustrating a cavity in FIG. 1.

FIG. 5 is a cross-sectional view taken along line A-A of FIG. 1.

FIG. 6 is a cross-sectional view taken along line B-B of FIG. 4.

FIG. 7 is a conceptual diagram of a light emitting device according to one embodiment of the present invention.

FIG. 8 is an enlarged view of portion A in FIG. 7.

FIG. 9 is a view illustrating a connection between a plurality of semiconductor device packages and lead electrodes.

FIG. 10 is a perspective view of FIG. 1 viewed from another direction.

FIG. 11 is a bottom view of FIG. 1.

FIG. 12 is a perspective view of a semiconductor device package according to a second embodiment of the present invention.

FIG. 13 is an exploded perspective view of FIG. 12.

FIG. 14 is a view illustrating a coupling relationship between a body and a substrate in FIG. 13.

FIG. 15 is a cross-sectional view taken along line C-C of FIG. 12.

FIG. 16 is a cross-sectional perspective view taken along line D-D of FIG. 13.

FIG. 17 is a conceptual diagram of a semiconductor device package according to a third embodiment of the present invention.

FIG. 18 is a plan view of FIG. 17.

FIG. 19 is a first modified example of FIG. 18.

FIG. 20 is a second modified example of FIG. 18.

FIG. 21 is a cross-sectional view of a semiconductor device package according to a fourth embodiment of the present invention.

FIG. 22 is a partially exploded perspective view of the semiconductor device package according to the fourth embodiment of the present invention.

FIG. 23 is a plan view of the semiconductor device package according to the fourth embodiment of the present invention.

MODES OF THE INVENTION

The embodiments may be modified into other forms or some of the embodiments may be combined, and the scope of the present invention is not limited to embodiments which will be described below.

Although items described in a specific embodiment are not described in another embodiment, the items may be understood as a description related to the other embodiment unless a description contrary to or contradicting the items is in the other embodiment.

For example, when a characteristic of a component A is described in a specific embodiment and a characteristic of a component B is described in another embodiment, the characteristics of the components are understood to fall within the scope of the present invention unless a contrary or contradictory description is present even when an embodiment in which the component A and the component B are combined is not clearly disclosed.

In the description of the embodiments, when one element is disclosed to be formed "on or under" another element, the term "on or under" includes both a case in which the two elements are in direct contact with each other and a case in which at least one other element is disposed between the two elements (indirect contact). Further, when the term "on or under" is expressed, a meaning of not only an upward direction but also a downward direction with respect to one element may be included.

Hereinafter, embodiments of the present invention will be described in detail with reference to the accompanying drawings so that those skilled in the art may easily carry out the embodiment of the present invention.

FIG. 1 is a conceptual diagram of a semiconductor device package according to a first embodiment of the present invention, FIG. 2 is an exploded perspective view of the semiconductor device package according to the first embodiment of the present invention viewed from above, and FIG. 3 is an exploded perspective view of the semiconductor device package according to the first embodiment of the present invention viewed from below.

Referring to FIGS. 1 to 3, the semiconductor device package according to the embodiment may include a substrate 200, a body 100 disposed on the substrate 200, a semiconductor device 400 disposed in the body 100, and a light transmission member 300 disposed at an upper portion of the body 100.

The substrate 200 may include an aluminum nitride (AlN) material. However, the present invention is not limited thereto, and various materials capable of reflecting ultraviolet light may be selected. For example, the substrate 200 may include aluminum oxide ($Al_2O_3$). The substrate 200 may be a polygonal shape, for example, a quadrangular shape.

A first electrode 230 and a second electrode 220 may be disposed on one surface of the substrate 200. The first electrode 230 and the second electrode 220 may be selected from Ti, Ru, Rh, Ir, Mg, W, Zn, Al, In, Ta, Pd, Co, Ni, Si, Ge, Ag, Au, and an alloy thereof. For example, the first electrode 230 and the second electrode 220 may each have a structure stacked in the order of W/Ti/Ni/Cu/Pd/Au.

The semiconductor device 400 may be disposed on the second electrode 220 and electrically connected to the first electrode 230 by a wire (not shown). However, the present invention is not limited thereto, and the semiconductor device 400 may be electrically connected to the first electrode 230 and the second electrode 220 by the wire. Further, the semiconductor device 400 may be implemented as a flip chip and may be disposed on the first electrode 230 and the second electrode 220. That is, the semiconductor device 400 may be electrically connected to the first electrode 230 and the second electrode 220 using various methods according to an electrode structure.

The semiconductor device 400 may output light in an ultraviolet wavelength range. For example, the semiconductor device 400 may output light (ultraviolet (UV)-A) in a near ultraviolet wavelength range, may output light (UV-B) in a far ultraviolet wavelength range, and may output light (UV-C) in a deep ultraviolet wavelength range. The wavelength range may be determined by a semiconductor structure included in the semiconductor device 400.

The semiconductor structure (not shown) may include a first conductive semiconductor layer, a second conductive semiconductor layer, and an active layer disposed between the first conductive semiconductor layer and the second conductive semiconductor layer.

The first conductive semiconductor layer may be an n-type semiconductor layer, and the second conductive semiconductor layer may be a p-type semiconductor layer. However, the present invention is not limited thereto, and the first conductive semiconductor layer may be a p-type semiconductor layer, and the second conductive semiconductor layer may be an n-type semiconductor layer.

The active layer may emit light by luminescent recombination of a carrier injected from the first conductive semiconductor layer and a carrier injected from the second conductive semiconductor layer.

In this case, a wavelength of light emitted according to a band gap energy magnitude of the active layer may be determined. For example, when the active layer has at least one quantum well and at least one quantum barrier, a wavelength of light emitted according to a band gap size of the quantum well may be determined.

Emission of the light from the quantum well may be induction emission or spontaneous emission. In the case of induction emission, a wavelength of the emitted light may have large intensity at a specific wavelength, and a phase of the emitted light may be the same, but in the case of spontaneous emission, the emitted light may have various wavelengths and various intensities according to the wavelength of the light. In this case, the wavelength of the emitted light may be defined as a wavelength of light having the greatest intensity of light compared to other wavelengths by measuring the relative intensity to the wavelength. Further, the active layer may be an n-type dopant and/or a p-type semiconductor layer, but is not limited thereto, and may be an intrinsic semiconductor layer.

The semiconductor structure may be composed of a compound semiconductor based on AlGaN, GaN, GaAs, GaP, or the like. Specifically, when the semiconductor structure is composed of a GaN-based compound semiconductor, and the semiconductor device 400 emits an ultraviolet ray, a wavelength of light emission may be determined by the Al composition (or content) of the semiconductor structure. For example, when an active layer the has a quantum well layer composed of AlGaN or GaN, a band gap of the quantum well layer may be variously adjusted according to the Al composition (or content), and in this case, the semiconductor structure may emit an ultraviolet ray according to a band gap size of the quantum well layer.

For example, the light (UV-A) in the near ultraviolet wavelength range may have a main peak in a wavelength range of 320 nm to 420 nm, the light (UV-B) in the far ultraviolet wavelength range may have a main peak in a wavelength range of 280 nm to 320 nm, and the light (UV-C) in the deep ultraviolet wavelength range may have a main peak in a wavelength range of 100 nm to 280 nm. However, the semiconductor device 400 may be manufactured to output light in a wavelength range required for light exposure.

The body 100 may be disposed on the substrate 200. The body 100 may be fixed onto the substrate 200 by an adhesive (not shown). For example, the adhesive may be solder or epoxy. However, the present invention is not limited thereto, and various adhesives capable of adhering a metal material and/or a semiconductor material may be selected as the adhesive.

The body 100 may include an upper surface 131 (one surface), a lower surface (the other surface), and a plurality of outer surfaces 121, 122, 123, and 124 disposed between the upper surface and the lower surface. The plurality of outer surfaces may include a first outer surface 121 and a third outer surface 123 opposite to each other, a second outer surface 122 and a fourth outer surface 124 opposite to each other, a first corner portion 127a disposed in a region where the first outer surface 121 and the second outer surface 122 meet each other, a second corner portion 127b disposed in a region where the second outer surface 122 and the third outer surface 123 meet each other, a third corner portion 127c disposed in a region where the third outer surface 123 and the fourth outer surface 124 meet each other, and a fourth corner portion 127d disposed in a region where the fourth outer surface 124 and the first outer surface 121 meet each other. The body 100 may be a polygonal shape, for example, a quadrangular shape.

The body 100 may include a cavity 110 passing through the upper surface 131 and the lower surface. An inner surface of the cavity 110 may reflect ultraviolet light. For example, the body 100 may be formed of AlN or aluminum oxide as a whole to reflect ultraviolet light or a separate reflective layer may be disposed in the cavity 110.

The cavity 110 may include a first cavity 110a having an inclined first surface 111 and a second surface 112 perpendicular to one surface 210 of the substrate 200, and a second cavity 110b which exposes the semiconductor device 400 through the lower surface of the body. The second cavity 110b may have a quadrangular shape, but is not limited thereto. A shape of the cavity 110 will be described later.

The body 100 may include a plurality of projecting portions 125a, 125b, 125c, and 125d protruding from corner portions facing diagonally among the first to fourth corner portions 127a, 127b, 127c, and 127d.

For example, the plurality of projecting portions 125a, 125b, 125c, and 125d may include a first projecting portion 125a protruding from the first corner portion 127a, a second projecting portion 125b protruding from the second corner portion 127b, a third projecting portion 125c protruding from the third corner portion 127c, and a fourth projecting portion 125d protruding from the fourth corner portion 127d.

However, the present invention is not limited thereto, and the plurality of projecting portions 125a and 125c may respectively include only the first projecting portion 125a protruding from the first corner portion 127a and the third projecting portion 125c protruding from the third corner portion 127c.

Each of the first to fourth projecting portions 125a, 125b, 125c, and 125d may have a polygonal pillar shape. For example, each of the first to fourth projecting portions 125a, 125b, 125c, and 125d may have a triangular pillar shape, but are not limited thereto, and may also have a quadrangular pillar shape or a pentagonal pillar shape.

The light transmission member 300 may be disposed on the body 100 to control light emitted from the semiconductor device 400. The light transmission member 300 may include a lens part 320. The lens part 320 may control the light emitted from the semiconductor device 400 so that the light may be uniformly irradiated. An example in which the lens part 320 has a dome shape is described, but the present invention is not limited thereto, and the lens part 320 may have various curvatures to uniformly control light.

The light transmission member 300 may include a first side surface 311 and a third side surface 313 opposite to each other, a second side surface 312 and a fourth side surface 314 opposite to each other, a first corner portion 316 disposed between the first side surface 311 and the second side surface 312, a second corner portion 317 disposed between the second side surface 312 and the third side surface 313, a third corner portion 318 disposed between the third side surface 313 and the fourth side surface 314, and a fourth corner portion 315 disposed between the fourth side surface 314 and the first side surface 311. The light transmission member 300 may have a polygonal shape, for example, a quadrangular shape.

The corner portions 315, 316, 317, and 318 of the light transmission member 300 may include coupling portions coupled to the plurality of projecting portions 125a, 125b, 125c, and 125d. The coupling portions of the light transmission member 300 may have shapes corresponding to the shapes of the projecting portions 125a, 125b, 125c, and 125d of the body 100. In the embodiment, an upper surface of each of the projecting portions 125a, 125b, 125c, and 125d of the body 100 may have a triangular shape. Accordingly, each of the coupling portions of the light transmission member 300 may have a flat surface. Accordingly, the corner portions 315, 316, 317, and 318 may be respectively inserted into the first to fourth projecting portions 125a, 125b, 125c, and 125d so that the light transmission member 300 may be fixed.

The light transmission member 300 may be fixed to the upper surface 131 of the body 100 by an adhesive (not shown). The adhesive may be a UV curable resin, but is not limited thereto.

The light transmission member 300 is not specifically limited as long as it is a material capable of transmitting light in an ultraviolet wavelength band. For example, the light transmission member 300 may use quartz or glass, but is not limited thereto, and may include an optical material having high UV wavelength transmittance.

FIG. 4 is a view illustrating the cavity in FIG. 1, FIG. 5 is a cross-sectional view taken along line A-A of FIG. 1, and FIG. 6 is a cross-sectional view taken along line B-B of FIG. 4.

Referring to FIGS. 4 to 6, the cavity 110 according to the embodiment may include the first cavity 110a having the inclined first surface 111 and the second surface 112 perpendicular to the substrate 200, and the second cavity 110b passing through the lower surface of the body 100 to expose the semiconductor device 400.

The first surface 111 may have a parabolic shape of which a cross-sectional area increases in a direction away from the substrate 200. Accordingly, the light emitted from the semiconductor device 400 is upwardly reflected, and thus the light flux may increase and uniform light distribution may be obtained.

The second surface 112 may be disposed on the first surface 111 and may be disposed perpendicular to the substrate 200. The second surface 112 may reduce a size of the semiconductor device package. When the first cavity 110a has a parabolic shape as a whole due to the first surface 111, since a circular cavity having a large diameter R1 is formed, the size of the semiconductor device package should be increased. Accordingly, when a plurality of semiconductor device packages are disposed, density may be reduced.

According to the embodiment, the second surface 112 may be partially formed in the first cavity 110a to reduce the size of the semiconductor device package. That is, since an inner side of the package has a parabolic shape, and an outer side of the package has a quadrangular shape, the plurality of semiconductor device packages may be densely disposed.

A ratio (H1:H2) of a maximum width in a vertical direction between the first surface 111 and the second surface 112 may be 1:0.5 to 1:0.7. The second surface 112 becomes wider to reduce the size of the semiconductor device package when the ratio is greater than 1:0.5, and a problem in that the second surface 112 becomes too wide and thus the light flux is reduced due to total reflection when the ratio is smaller than 1:0.7 may be prevented.

A plurality of second surfaces 112 may be respectively disposed between the corner portions 127a, 127b, 127c, and 127d of the body 100. For example, the plurality of second surfaces 112 may be respectively disposed between the first corner portion 127a and the second corner portion 127b, between the second corner portion 127b and the third corner portion 127c, between the third corner portion 127c and the fourth corner portion 127d, and between the fourth corner portion 127d and the first corner portion 127a.

In this case, a vertical width H2 of the second surface 112 may decrease in a direction toward the first to fourth corner portions 127a, 127b, 127c, and 127d. Accordingly, the second surface 112 may have a semicircular shape. In the case in which the vertical width H2 of the second surface 112 increases or does not change in the direction toward the first to fourth corner portions 127a, 127b, 127c, and 127d, it may be difficult for the first cavity 110a to have a parabolic shape as a whole, and thus achieving a desired light distribution may be difficult. Further, since a vertical surface becomes wider, an amount of light which is upwardly emitted is reduced, and thus the light flux may be reduced.

The first surface 111 may extend to regions between the plurality of second surfaces 112. That is, the first surface 111 may extend toward the first to fourth corner portions 127a, 127b, 127c, and 127d to partition the plurality of second surfaces 112.

The second cavity 110b may have a size capable of exposing the semiconductor device 400. For example, the second cavity 110b may have a quadrangular shape, but is not limited thereto. The second cavity 110b may also have a polygonal shape or a circular shape.

A side surface of the second cavity 110b may include a third surface 113 perpendicular to the substrate 200. The third surface 113 may be parallel to the second surface 112. That is, the second surface 112 and the third surface 113 may be surfaces perpendicular to the substrate 200.

A vertical width H3 of the third surface 113 may increase in the direction toward the first to fourth corner portions 127a, 127b, 127c, and 127d. That is, the width of the second surface 112 decreases in the direction toward the first to fourth corner portions 127a, 127b, 127c, and 127d, but the vertical width H3 of the third surface 113 may increase in the direction toward the first to fourth corner portions 127a, 127b, 127c, and 127d. According to this configuration, since the second cavity 110b may be formed in the polygonal shape, a wire mounting area may be secured. Accordingly, reliability of the device may be improved.

A first boundary CL1 between the first surface 111 and the second surface 112 may have a curved line, and a second boundary CL2 between the third surface 113 and the first surface 111 may have a curved line. In this case, the curved lines of the first boundary CL1 and the second boundary CL2 may have the same curvature. According to this configuration, the size of the body 100 may be reduced, and the cavity 110 may be formed in the polygonal shape to secure the wire mounting area, and the like.

The substrate 200 may include the first electrode 230 and the second electrode 220 disposed on one surface, and a first pad 240, a second pad 260, and a third pad 250 disposed on a lower surface. The first pad 240 may be electrically connected to the first electrode 230 by a through electrode, and the second pad 260 may be electrically connected to the second electrode 220 by a through electrode. The third pad 250 disposed between the first pad 240 and the second pad 260 may be a heat dissipation pad. The first to third pads 240, 250, and 260 may be formed of a material the same as a material forming the first electrode 230 and the second electrode 220, but are not limited thereto.

The first electrode 230 and the second electrode 220, and the first to third pads 240, 250, and 260 may be selected from Ti, Ru, Rh, Ir, Mg, W, Zn, Al, In, Ta, Pd, Co, Ni, Si, Ge, Ag, Au, and an alloy thereof. For example, the first electrode 230 and the second electrode 220, and the first to third pads 240, 250, and 260 may each have a structure stacked in the order of W/Ti/Ni/Cu/Pd/Au.

FIG. 7 is a conceptual diagram of a light emitting device according to one embodiment of the present invention, FIG. 8 is an enlarged view of portion A in FIG. 7, FIG. 9 is a view illustrating a connection between a plurality of semiconductor device packages and a circuit pattern, FIG. 10 is a perspective view of FIG. 1 viewed from another direction, and FIG. 11 is a bottom view of FIG. 1.

Referring to FIG. 7, the light emitting device according to the embodiment may include a stage 30 and light source modules 10 and 20 disposed on the stage 30. The light emitting device according to the embodiment may be a concept including a sterilizing device, a curing device, an exposure device, a lighting device, a display device, and a vehicle lamp. Hereinafter, the light emitting device will be described as an exposure machine as an example.

An object to be exposed 41 may be disposed on the stage 30, and a mask pattern 42 may be disposed between the object to be exposed 41 and the light source modules 10 and 20. Accordingly, ultraviolet light may selectively enter the object to be exposed 41 according to the mask pattern 42. All structures of the conventional exposure machine may be applied to this structure.

The light source modules 10 and 20 may include a circuit board 20 and a plurality of semiconductor device packages 10 disposed on the circuit board 20. In the light source modules 10 and 20 of the light emitting device, it may be important that the plurality of semiconductor device packages 10 are disposed as densely as possible. When an interval between the semiconductor device packages decreases, light flux and illuminance uniformity of a target surface may be improved.

Referring to FIGS. 8 and 9, a first lead electrode 21 may be electrically connected to a first semiconductor device package 10a, and a second lead electrode 22 may be electrically connected to the first semiconductor device package 10a and a fourth semiconductor device package 10d.

A third lead electrode 23 may be electrically connected to a fifth semiconductor device package 10e through a space between the first semiconductor device package 10a and a second semiconductor device package 10b. In this case, the third lead electrode 23 may partially overlap the first semiconductor device package 10a and the second semiconductor device package 10b. However, the third lead electrode 23 may be spaced apart from the pads 240, 250, 260 of the first semiconductor device package 10a and the second semiconductor device package 10b to prevent a short circuit.

That is, in the light source module according to the embodiment, lead electrodes 21, 22, 23, 24, 25, 26, 27 may be overlappingly disposed between the plurality of semiconductor device packages 10a, 10b, 10c, 10d, 10e, and 10f. According to this configuration, illuminance uniformity may be improved by reducing the interval between the semiconductor device packages.

The lead electrodes 21, 22, 23, 24, 25, 26, and 27 according to the embodiment may be individually connected to the semiconductor device packages 10a, 10b, 10c, 10d, 10e, and 10f. Accordingly, current values applied to the semiconductor device packages through the lead electrode may be controlled to be different. For example, the current values applied to the semiconductor device packages disposed at the edge regions of the light source modules 10 and 20 may be controlled to be lower. According to this configuration, in the light source module, the current value is controlled to be relatively high in a low-illuminance region and the current value is controlled to be relatively low in a high-illumination region so that illumination uniformity may be improved as a whole. However, in a section where the illuminance is uniformly maintained (for example, a central region of the light source module), the same current may be applied by connecting common lead electrodes to the plurality of semiconductor device packages.

Referring to FIGS. 10 and 11, the body 100 of the semiconductor device package according to the embodiment may include a lower surface 132 disposed on the substrate 200, a plurality of side surfaces 121, 122, 123, and 124 perpendicular to the substrate 200, and an inclined surface 126 which connects the plurality of side surfaces 121, 122, 123, and 124 and the lower surface 132. In the embodiment, a case in which the plurality of side surfaces 121, 122, 123, and 124 are disposed perpendicular to the substrate 200 is described, but the present invention is not limited thereto, and the plurality of side surfaces 121, 122, 123, and 124 may be inclined.

The body 100 may be disposed on the substrate 200. In this case, the lower surface 132 of the body 100 may be smaller than the substrate 200. That is, the lower surface 132 of the body 100 may be disposed at an inner side of the substrate 200. On the other hand, the outer surfaces 121, 122, 123, and 124 of the body 100 may be disposed at an outer side of the substrate 200. Accordingly, a cross-sectional area cut through the side surfaces 121, 122, 123, and 124 of the body 100 may be greater than the substrate 200.

According to the embodiment, since the inclined surface 126 which connects the plurality of outer surfaces 121, 122, 123, and 124 and the lower surface 132 is inclined to have an area which decreases in a direction toward the substrate 200, even when the side surfaces 121, 122, 123, and 124 of the body 100 are disposed at the outer side of the substrate 200, the lower surface 132 of the body 100 may be disposed at the inner side of the substrate 200. Accordingly, the plurality of pads 240, 250, 260 disposed on the substrate 200 may be disposed at inner sides of the side surfaces 121, 122, 123, and 124 of the body 100. Accordingly, the lead electrodes of the circuit board 20 may be spaced apart from the pads 240, 250, and 260 even when partially overlapping the body 100. Accordingly, an electrical insulation property may be secured even when the semiconductor device packages are densely disposed.

A ratio between the area of the substrate 200 and the maximum cross-sectional area of the body 100 may be 1:1.2 to 1:1.8. The maximum cross-sectional area of the body 100 may be an area formed by the plurality of side surfaces 121, 122, 123 and 124. When the ratio is 1:1.2 or more, the area of the substrate 200 is sufficiently small, and thus the substrate 200 may be electrically insulated from the pads of the substrate 200 even when the body 100 and the lead electrodes partially overlap. Further, when the ratio is 1:1.8 or less, the area of the body 100 may be small and thus it is possible to densely dispose.

FIG. 12 is a perspective view of a semiconductor device package according to a second embodiment of the present invention, FIG. 13 is an exploded perspective view of FIG. 12, and FIG. 14 is a view illustrating a coupling relationship between a body and a substrate in FIG. 13.

Referring to FIGS. 12 and 13, the semiconductor device package according to the embodiment may include a substrate 200, a body 100 disposed on the substrate 200, a semiconductor device 400 disposed in the body 100, and a light transmission member 300 disposed at an upper portion of the body 100.

The substrate 200 may include an aluminum nitride (AlN) material. However, the present invention is not limited thereto, and various materials capable of reflecting ultraviolet light may be selected. For example, the substrate 200 may include aluminum oxide ($Al_2O_3$). The substrate 200 may be a polygonal shape, for example, a quadrangular shape.

A first electrode 230 and a second electrode 220 may be disposed on one surface of the substrate 200. The first electrode 230 and the second electrode 220 may be selected from Ti, Ru, Rh, Ir, Mg, W, Zn, Al, In, Ta, Pd, Co, Ni, Si, Ge, Ag, Au, and an alloy thereof. For example, the first electrode 230 and the second electrode 220 may each have a structure stacked in the order of W/Ti/Ni/Cu/Pd/Au.

The semiconductor device 400 may be disposed on the second electrode 220 and electrically connected to the first electrode 230 by a wire. However, the present invention is not limited thereto, and the semiconductor device 400 may be electrically connected to the first electrode 230 and the second electrode 220 by the wire. Further, the semiconductor device 400 may be implemented as a flip chip and may be disposed on the first electrode 230 and the second electrode 220. That is, the semiconductor device 400 may be electrically connected to the first electrode 230 and the second electrode 220 using various methods according to an electrode structure.

The semiconductor device 400 may output light in an ultraviolet wavelength range. For example, the semiconductor device 400 may output light (ultraviolet (UV)-A) in a near ultraviolet wavelength range, may output light (UV-B) in a far ultraviolet wavelength range, and may output light (UV-C) in a deep ultraviolet wavelength range. The wavelength range may be determined by a composition ratio of Al in the semiconductor structure. However, the present invention is not limited thereto, and the semiconductor device 400 may be manufactured to output light in a wavelength range required for light exposure.

The body 100 may include a first outer surface 121 and a third outer surface 123 opposite to each other, a second outer surface 122 and a fourth outer surface 124 opposite to each other, a first corner portion 127a disposed between the first outer surface 121 and the second outer surface 122, a second corner portion 127b disposed between the second outer surface 122 and the third outer surface 123, a third corner portion 127c disposed between the third outer surface 123 and the fourth outer surface 124, and a fourth corner portion 127d disposed between the fourth outer surface 124 and the first outer surface 121. The body 100 may be a polygonal shape, for example, a quadrangular shape.

The body 100 may include a cavity 110 passing through an upper surface and a lower surface. An inner surface of the cavity 110 may reflect ultraviolet light. For example, the body 100 itself may be formed of AlN or aluminum oxide to reflect ultraviolet light or a separate reflective layer may be disposed in the cavity 110.

The cavity 110 may include a first cavity 110a having an inclined first surface 111 and a second surface 112 perpendicular to the substrate 200, and a second cavity 110b which exposes the semiconductor device 400. The second cavity 110b may have a quadrangular shape but is not limited thereto.

The body 100 may include a plurality of projecting portions 125a, 125b, 125c, and 125d protruding from corner portions facing diagonally among the first to fourth corner portions 127a, 127b, 127c, and 127d.

For example, a plurality of projecting portions 125a and 125c may include a first projecting portion 125a protruding from the first corner portion 127a and a third projecting portion 125c protruding from the third corner portion 127c. In this case, the second corner portion 127b and the fourth corner portion 127d where the projecting portions are not formed may provide a space where a vacuum chuck holds the body 100.

However, the present invention is not limited thereto, and the plurality of projecting portions may further include a second projecting portion (not shown) protruding from the second corner portion 127b and a fourth projecting portion (not shown) protruding from the fourth corner portion 127d.

Each of the first and third projecting portions 125a and 125c may have a polygonal pillar shape. For example, each of the first and third projecting portions 125a and 125c may have a triangular pillar shape, but are not limited thereto, and may also have a quadrangular pillar shape or a pentagonal pillar shape.

The light transmission member 300 may be disposed on the body 100 to control light emitted from the semiconductor device 400. The light transmission member 300 may include a lens part 320. The lens part 320 may control light flux of the light emitted from the semiconductor device 400 so that the light may be uniformly irradiated. An example in which the lens part 320 has a dome shape is described, but the present invention is not limited thereto, and the lens part 320 may have various curvatures to uniformly control light.

The light transmission member 300 may include a first side surface 311 and a third side surface 313 opposite to each other, a second side surface 312 and a fourth side surface 314 opposite to each other, a first corner portion 316 disposed between the first side surface 311 and the second side surface 312, a second corner portion 317 disposed between the second side surface 312 and the third side surface 313, a third corner portion 318 disposed between the third side surface 313 and the fourth side surface 314, and a fourth corner portion 315 disposed between the fourth side surface 314 and the first side surface 311. The light transmission member 300 may have a polygonal shape, for example, a quadrangular shape.

The light transmission member 300 may include a flat surface disposed at corner portions opposite to the plurality of projecting portions 125a and 125c. Accordingly, the light transmission member 300 may be fixed by the first and third projecting portions 125a and 125c.

In this case, the first projecting portion 125a and the third projecting portion 125c may include first fastening portions 125-1 disposed at surfaces opposite to each other, and the light transmission member 300 may include second fastening portions 316a and 318a disposed at the first corner portion 316 and the third corner portion 318 to be coupled to the first fastening portions 125-1.

In this case, the first fastening portions 125-1 may be projections, and the second fastening portions 316a and 318a may be grooves but are not limited thereto. For example, the first fastening portions 125-1 may be grooves and the second fastening portions 316a and 318a may be projections. The first fastening portions 125-1 and the second fastening portions 316a and 318a may extend in protruding directions of the first and third projecting portions 125a and 125c. According to this configuration, the light transmission member 300 may be stably inserted and fixed to the first and third projecting portions 125a and 125c.

The light transmission member 300 may be fixed onto one surface of the body 100 by an adhesive (not shown). The adhesive may be an ultraviolet (UV) curable resin but is not limited thereto The light transmission member 300 is not specifically limited as long as it is a material capable of transmitting light in an ultraviolet wavelength band. For example, the light transmission member 300 may include an optical material having high UV wavelength transmittance such as quartz or glass but is not limited thereto.

Referring to FIG. 14, the substrate 200 may include a second electrode 220 on which the semiconductor device 400 is disposed, a first electrode 230 disposed to be spaced apart from the second electrode 220, and a first protruding portion 270 disposed along an edge of the substrate 200.

The first electrode 230, the second electrode 220, and the first protruding portion 270 may be manufactured by forming an electrode layer on the substrate 200 and then patterning the electrode layer. That is, the first protruding portion 270 may be electrically insulated from the semiconductor device 400. Accordingly, the first electrode 230, the second electrode 220, and the first protruding portion 270 may have the same material. For example, the first electrode 230, the second electrode 220, and the first protruding portion 270 may be selected from Ti, Ru, Rh, Ir, Mg, Zn, Al, In, Ta, Pd, Co, Ni, Si, Ge, Ag, Au, and an alloy thereof.

A thickness of the first protruding portion 270 may be the same as those of the first electrode 230 and the second electrode 220. However, the present invention is not limited thereto, and the thickness of the first protruding portion 270 may be greater than those of the first electrode 230 and the second electrode 220.

A second protruding portion 132b where the second cavity 110b is disposed and a concave portion 132a disposed along an edge are disposed in a lower surface 132 of the body 100, and the first protruding portion 270 may be inserted into the concave portion 132a. Accordingly, the substrate 200 and the body 100 may be easily assembled and alignment may be improved. Further, rotation of the body 100 after assembly may be prevented.

FIG. 15 is a cross-sectional view taken along line C-C of FIG. 12, and FIG. 16 is a cross-sectional perspective view taken along line D-D of FIG. 13.

Referring to FIGS. 15 and 16, the cavity 110 according to the embodiment may include the first cavity 110a, which has an inclined first surface 111 and a second surface 112 perpendicular to the substrate 200, and the second cavity 110b which exposes the semiconductor device 400.

The first surface 111 may have a parabolic shape of which a cross-sectional area increases in a direction away from the substrate 200. Accordingly, the light emitted from the semiconductor device 400 is upwardly reflected, and thus the light flux may increase and uniform light distribution may be obtained.

The second surface 112 may be disposed on the first surface 111 and may be disposed perpendicular to the substrate 200. The second surface 112 may reduce a size of the semiconductor device package. When the first cavity 110a has a parabolic shape as a whole due to the first surface 111, the size of the semiconductor device package should be increased.

According to the embodiment, the second surface 112 may be partially formed in the first cavity 110a to reduce the size of the semiconductor device package. Accordingly, the semiconductor device packages may be densely disposed.

A ratio (H1:H2) of a maximum width in a vertical direction between the first surface 111 and the second surface 112 may be 1:0.5 to 1:0.7. The second surface 112 becomes wider to reduce the size of the semiconductor device package when the ratio is greater than 1:0.5 and a problem in that the second surface 112 becomes too wide and thus the light flux is reduced due to total reflection when the ratio is smaller than 1:0.7 may be prevented.

Referring to FIG. 13, a plurality of second surfaces 112 may be respectively disposed between the corner portions of the body 100. For example, the plurality of second surfaces 112 may be respectively disposed between the first corner portion 127a and the second corner portion 127b, between the second corner portion 127b and the third corner portion 127c, between the third corner portion 127c and the fourth corner portion 127d, and between the fourth corner portion 127d and the first corner portion 127a.

In this case, a vertical width of the second surface 112 may decrease in a direction toward the first to fourth corner portions 127a, 127b, 127c, and 127d. Accordingly, the second surface 112 may have a semicircular shape. In the case in which a vertical width H2 of the second surface 112 increases or does not change in the direction toward the first to fourth corner portions 127a, 127b, 127c, and 127d, it may be difficult for the first cavity 110a to have a parabolic shape as a whole, and thus achieving a desired light distribution may be difficult. Further, the light flux may be reduced.

The first surface 111 may extend to regions between the plurality of second surfaces 112. That is, the first surface 111 may extend to the first to fourth corner portions 127a, 127b, 127c, and 127d to partition the plurality of second surfaces 112.

Referring to FIGS. 15 and 16, the second cavity 110b may be disposed under the first cavity 110a. The second cavity 110b may be disposed to surround the semiconductor device 400. The second cavity 110b may also have a polygonal shape or a circular shape.

The second cavity 110b may include a third surface 113 perpendicular to the substrate 200. The third surface 113 of the second cavity 110b may be parallel to the second surface 112.

The third surface 113 of the second cavity 110b may include a first inner surface 113a and a third inner surface 113c opposite to each other, and a second inner surface 113b and a fourth inner surface 113d opposite to each other, a horizontal length of each of the first inner surface 113a and the third inner surface 113c may be greater than a horizontal length of each of the second inner surface 113b and the fourth inner surface 113d, and a vertical width H4 of each of the second inner surface 113b and the fourth inner surface 113d may be greater than a vertical width H3 of each of the first inner surface 113a and the third inner surface 113c.

The first inner surface 113a of the second cavity 110b may be disposed opposite to a first side surface 121 of the body 100, and the third inner surface 113c may be disposed opposite to a third side surface 123 of the body 100.

Further, the second inner surface 113b of the second cavity 110b may be disposed opposite to a second side surface 122 of the body 100, and the fourth inner surface 113d may be disposed opposite to a fourth side surface 124 of the body 100.

The vertical width H3 of each of the first inner surface 113a and the third inner surface 113c of the second cavity 110b may increase in a direction toward the second inner surface 113b and the fourth inner surface 113d of the second cavity 110b. According to this configuration, since the shape of the second cavity 110b disposed under the first surface 111 may be formed in a polygonal shape, a wire mounting area and the like may be secured. Accordingly, reliability of the device may be improved. A vertical width H4 of each of the second inner surface 113b and the third inner surface 113c may be smaller than the vertical width H2 of the first surface 111.

FIG. 17 is a conceptual diagram of a semiconductor device package according to a third embodiment of the present invention, FIG. 18 is a plan view of FIG. 17, FIG. 19 is a first modified example of FIG. 18, and FIG. 20 is a second modified example of FIG. 18.

Referring to FIGS. 17 and 18, the semiconductor device package according to the embodiment may include a body 510 including a plurality of cavities 511, a plurality of semiconductor devices 400 respectively disposed in the plurality of cavities 511, and a light transmission member 520 including a plurality of lens parts 521 disposed on the plurality of cavities 511.

The body 510 may include the plurality of cavities 511. The body 510 may be manufactured by processing an aluminum substrate. Accordingly, both an inner surface and an outer surface of the body 510 according to the embodiment may have conductivity. This structure may have various advantages. When a non-conductive material such as AlN or $Al_2O_3$ is used as the body 510, since reflectance of an ultraviolet wavelength band is as small as 20% to 40%, there is a problem in that a separate reflection member should be disposed. Further, a separate conductive member such as a lead frame and a circuit pattern may be required. Accordingly, manufacturing costs may increase and a process may be complicated. Further, a conductive member such as gold (Au) absorbs ultraviolet rays, and thus there is a problem in that light extraction efficiency is reduced.

However, according to the embodiment, since the body 510 itself is made of aluminum, the reflectance is high in the ultraviolet wavelength range, and thus the separate reflection member may be omitted. Further, since the body 510 itself is conductive, the separate circuit pattern and the lead frame may be omitted. In addition, since the body 510 is manufactured of aluminum, heat conductivity may be excellent in a range from 140 W/m.k to 160 W/m.k. Accordingly, heat radiation efficiency may be improved The body 510 may include a plurality of conductive portions 512 disposed in a first direction (a horizontal direction). Insulation lines 514a and 514b may be disposed between the plurality of conductive portions 512. Since the plurality of conductive portions 512 have conductivity, the insulation lines 514a and 514b have to be disposed to separate electrodes. Accordingly, the insulation lines 514a and 514b may pass through the plurality of cavities 511 in a second direction (a vertical direction). In this case, a first insulation line 514a may pass through a bottom surface 511a of the cavity 511 disposed on a first row L1, and a second insulation line 514b may pass through a bottom surface 511a of the cavity disposed on a second row L2.

The insulation lines 514a and 514b may include all of various materials having insulation functions. For example, the insulation lines 514a and 514b may include a resin such as polyimide but are not limited thereto. A thickness of each of the insulation lines 514a and 514b may be 10 μm to 100 μm. When the thickness is 10 μm or more, the plurality of conductive portions 512 may be sufficiently insulated, and when the thickness is 70 μm or less, a problem in that a size of the package increases may be improved.

A shape of the cavity 110 is not specifically limited. The cavity 110 may have a parabolic shape as a whole. The cavity 110 may have a circular shape in a plan view, but is not limited thereto, and may have a polygonal shape. That is, the cavity 110 may have the structure of the above-described cavity 110.

The light transmission member 520 may include the plurality of lens parts 521 disposed on the plurality of cavities 110. A shape of the light transmission member 520 may correspond to a shape of the body 510. As shown in FIG. 18, when the body 510 has a hexagonal shape, the light transmission member 520 may also have a hexagonal shape. When an outer surface of the body 510 has a hexagonal shape, the cavities 110 disposed in the body 510 may be most densely disposed. Accordingly, since the number of semiconductor devices 400 per unit area increases, light output may be improved. In this case, the cavities 511 may be alternately disposed to reduce a space between the cavities 511. However, the shape of the body is not limited thereto, and the body may have various polygonal shapes or a circular shape. For example, the body 510 may have a quadrangular shape as shown in FIG. 19 and may also have a triangular shape as shown in FIG. 20.

FIG. 21 is a cross-sectional view of a semiconductor device package according to a fourth embodiment of the present invention, FIG. 22 is a partially exploded perspective view of the semiconductor device package according to the fourth embodiment of the present invention, and FIG. 23 is a plan view of the semiconductor device package according to the fourth embodiment of the present invention.

Referring to FIGS. 21 and 22, a semiconductor device package 600 according to the embodiment may include a substrate 610, a body 620 disposed on the substrate 610 and including a plurality of cavities 621, a plurality of semiconductor devices 400 respectively disposed in the plurality of cavities 621, and a light transmission member 630 including a plurality of lens parts 631 disposed on the plurality of cavities 621.

The plurality of semiconductor device packages in FIG. 15 may be combined to form the semiconductor device package according to the embodiment. That is, the plurality of semiconductor devices 400 may be disposed on the substrate 610, and the cavities 621, in which the semiconductor devices 400 may be disposed, may be formed in the body 620. Further, the light transmission member 630 may include the plurality of lens parts 631 disposed on the plurality of cavities 621.

In this case, all structures described in FIGS. 12 to 16 may be applied to the semiconductor device package. For example, the cavity 621 may include a first surface 111 which is inclined and a second surface 112 perpendicular to the substrate 610. Further, the cavity 621 may also have the structure of the second cavity 110b. In addition, all the above-described structures in FIGS. 1 to 11 may also be applied.

According to the embodiment, Zener diodes 410 may be disposed in grooves 624 formed in the body. According to this configuration, light emitted from the semiconductor device 400 may be prevented from absorption to the Zener diodes 410 so that the light output may be improved. The grooves 624 may be connected to or spaced apart from the second cavity 110b. The Zener diodes 410 may be electrically connected to the circuit pattern of the semiconductor device 400.

Referring to FIG. 23, the semiconductor device package 600 may have a quadrangular shape. However, the present invention is not limited thereto, and the semiconductor device package may have various polygonal shapes such as a triangular shape, a pentagonal shape, and a hexagonal shape.

The semiconductor device may be applied to various types of light emitting devices. For example, the light emitting device may be a concept including a sterilizing device, a curing device, an exposure device, a lighting device, a display device, and a vehicle lamp. That is, the semiconductor device may be applied to various electronic devices disposed in a case to provide light.

The sterilizing device may be provided with the semiconductor device according to the embodiment to sterilize a desired region. The sterilizing device may be applied to household appliances such as a water purifier, an air conditioner, a refrigerator, and the like, but is not limited thereto. That is, the sterilizing device may be applied to all of various products (for example, medical devices) which require sterilization.

For example, the water purifier may be provided with the sterilizing device according to the embodiment to sterilize circulating water. The sterilizing device may be disposed on a nozzle or a discharge port through which water circulates to irradiate ultraviolet rays. In this case, the sterilizing device may include a waterproof structure.

The curing device may be provided with the semiconductor device according to the embodiment to cure various types of liquid. The liquid may be the broadest concept including all various materials which are cured when ultraviolet rays are irradiated. For example, the curing device may cure various types of resins. Alternatively, the curing device may be applied to cure beauty products such as nail polish.

The exposure device may transfer a desired pattern onto a photosensitive film by placing a mask, on which a desired pattern is formed, on a sample coated with a photo-resist which is a material that reacts to light, and irradiating ultraviolet rays. For example, in a semiconductor device or a printed circuit board (PCB), and a display panel embedded as a main component of an electronic device, a fine circuit pattern may be formed using photolithography technology in an exposure process.

The lighting device may include a light source module including a substrate and the semiconductor device of the embodiment, a heat dissipation part which dissipates heat of the light source module, and a power supply which processes or converts electrical signals received from the outside to provide the electrical signals to the light source module. Further, the lighting device may include a lamp, a head lamp, a street light, or the like.

The display device may include a bottom cover, a reflection plate, a light emitting module, a light guide plate, an optical sheet, a display panel, an image signal output circuit, and a color filter. The bottom cover, the reflection plate, the light emitting module, the light guide plate, and the optical sheet may constitute a backlight unit.

The reflection plate may be disposed on the bottom cover, and the light emitting module may emit light. The light guide plate may be disposed in front of the reflection plate to guide the light emitted from the light emitting module to the front, and the optical sheet may include a prism sheet or the like to be disposed in front of the light guide plate. The display panel may be disposed in front of the optical sheet, the image signal output circuit may supply image signals to the display panel, and the color filter may be disposed in front of the display panel.

The semiconductor device may be used as an edge type backlight unit or a direct type backlight unit when used as the backlight unit of the display device.

The semiconductor device may be a laser diode in addition to the above-described light emitting diode.

The laser diode may include a first conductive semiconductor layer, an active layer, and a second conductive semiconductor layer of the above-described structure like the light emitting device. Further, although an electroluminescence phenomenon in which light is emitted when current flows after bonding a p-type first conductive semiconductor and an n-type second conductive semiconductor is used, there are differences in directivity and phase of the emitted light. That is, since light having one specific wavelength (monochromatic beam) may be emitted in the same direction with the same phase using a phenomenon referred to as stimulated emission and a constructive interference phenomenon, the laser diode may be used for optical communication, medical equipment, semiconductor process equipment, and the like due to these characteristics.

A photodetector which is a kind of transducer which detects light and then converts intensity of the light to electrical signals may be exemplified as a light receiving device. The photodetector may include a photovoltaic cell (silicon, selenium), an optical output device (cadmium sulfide, cadmium selenide), a photodiode (for example, a photodiode (PD) having a peak wavelength in a visible blind spectral region or a true blind spectral region), a photo transistor, a photomultiplier tube, a phototube (vacuum, gas encapsulation), an infra-red (IR) detector, or the like, but the embodiment is not limited thereto.

Further, the semiconductor device such as the photodetector may be generally manufactured using a direct bandgap semiconductor having excellent light conversion efficiency. Alternatively, the photodetector has various structures, and the most common structure includes a pin type photodetector using a p-n junction, a Schottky type photodetector using a Schottky junction, and a metal semiconductor metal (MSM) type photodetector.

The photodiode may include a first conductive semiconductor layer, an active layer, and a second conductive semiconductor layer having the above-described structure like the light emitting device, and is formed of a p-n junction or a pin structure. The photodiode operates by applying reverse bias or zero bias, and when light is incident on the photodiode, electrons and holes are generated and thus current flows. In this case, a magnitude of the current may be almost proportional to intensity of the light incident on the photodiode.

A photovoltaic cell or a solar cell is one of photodiodes and may convert light to an electric current. The solar cell may include a first conductive semiconductor layer, an active layer, and a second conductive semiconductor layer having the above-described structure like the light emitting device.

Further, it may be used as a rectifier of an electronic circuit through rectifying characteristics of a general diode using a p-n junction and may be applied to an ultra-high frequency circuit to be applied to an oscillation circuit or the like.

In addition, the above-described semiconductor device is not necessarily implemented only as a semiconductor and may further include a metal material in some cases. For example, the semiconductor device such as the light receiving device may be implemented using at least one of Ag, Al, Au, In, Ga, N, Zn, Se, P, or As and may also be implemented using a semiconductor material doped with a p-type dopant or an n-type dopant or an intrinsic semiconductor material.

Although the above-described embodiments are mainly described with reference to the embodiments of the present invention, the above are only exemplary, and it should be understood that those skilled in the art may variously perform modifications and applications within the principle of the embodiments. For example, elements specifically shown in the embodiments may be modified. Further, differences related to modifications and changes should be understood as being included in the scope of the present invention defined in the appended claims.

The invention claimed is:

1. A semiconductor device package comprising:
a body including a plurality of cavities separated from each other to be non-overlapped, each of the plurality of cavities including a bottom surface, and a slope surface connected to the bottom surface;
a substrate disposed on the bottom surface of the cavity; and
a plurality of semiconductor devices disposed in one surface of the substrate to be separately inserted into the plurality of cavities and positioned in the body such that only a single one of the semiconductor devices is separately disposed within each of the cavities,
wherein the plurality of cavities are disposed along a plurality of rows that includes a first row and a second row, wherein a first set of the cavities are arranged in the first row, and a second set of the cavities are arranged in the second row,
wherein the body includes:
a plurality of conductive portions disposed in a first direction; and
a plurality of insulation lines disposed in parallel in a second direction crossing the first direction between the plurality of conductive portions to electrically insulate the plurality of conductive portions,
wherein the plurality of insulation lines includes:
a first insulation line passing through a bottom surface of a second cavity of the first set of the cavities arranged in the first row and passing through a slope surface of a second cavity of the second set of the cavities arranged in the second row; and
a second insulation line passing through a slope surface of a first cavity of the first set of the cavities arranged in the first row and passing through a bottom surface of a first cavity of the second set of the cavities arranged in the second row,
wherein the substrate includes:
a first electrode and a second electrode disposed on one surface of the substrate; and
a first pad, a second pad and a third pad disposed on a lower surface of the substrate;
wherein the first pad is electrically connected to the first electrode, the second pad is electrically connected to the second electrode, and the third pad disposed between the first pad and the second pad is a heat dissipation pad.

2. The semiconductor device package of claim 1, wherein the body includes a horizontal surface connecting the slope surfaces of the cavities.

3. The semiconductor device package of claim 2, further comprising a light transmission member provided with a plurality of coupling portions coupled to a plurality of protruding portions disposed at an upper corner of the body, and fixed to the body by coupling of the plurality of protruding portions and the plurality of coupling portions.

4. The semiconductor device package of claim 1, wherein the slope surface has a parabolic shape of which a cross-sectional area increases in a direction away from the substrate.

5. The semiconductor device package of claim 1, wherein the cavity has a polygonal shape.

6. The semiconductor device package of claim 1, wherein a horizontal width of the cavity is formed to decrease in a direction toward the bottom surface.

* * * * *